United States Patent
Li

(10) Patent No.: US 9,705,711 B2
(45) Date of Patent: Jul. 11, 2017

(54) SIGNAL MIXING METHOD AND MIXER

(71) Applicant: MONTAGE TECHNOLOGY (SHANGHAI) CO., LTD., Shanghai (CN)

(72) Inventor: Zhenbiao Li, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/141,830

(22) Filed: Apr. 29, 2016

(65) Prior Publication Data

US 2016/0330050 A1  Nov. 10, 2016

(30) Foreign Application Priority Data

May 7, 2015 (CN) .......................... 2015 1 0230841

(51) Int. Cl.
*H04L 25/49* (2006.01)
*H03D 7/14* (2006.01)
*H03D 7/16* (2006.01)

(52) U.S. Cl.
CPC ....... *H04L 25/4902* (2013.01); *H03D 7/1441* (2013.01); *H03D 7/1458* (2013.01); *H03D 7/1466* (2013.01); *H03D 7/165* (2013.01)

(58) Field of Classification Search
CPC .. H04L 25/4902; H03D 7/165; H03D 7/1458; H03D 7/1466; H03D 7/1441; H03F 2203/45288; H03F 2203/45526; H04B 1/40
See application file for complete search history.

(56) References Cited

U.S. PATENT DOCUMENTS

| | | | | |
|---|---|---|---|---|
| 2005/0239430 A1* | 10/2005 | Shah | .................. | H03D 7/14 455/326 |
| 2012/0046007 A1* | 2/2012 | Rafi | .................. | H03D 7/00 455/209 |
| 2012/0322398 A1* | 12/2012 | Pullela | .................. | H03D 7/1466 455/302 |

* cited by examiner

*Primary Examiner* — Syed Haider
(74) *Attorney, Agent, or Firm* — Jun He Law Offices P.C.; James J. Zhu

(57) ABSTRACT

A mixer includes a weighting module configured to receive an input signal and to weight the input signal with a set of weighting factors, in order to generate a set of weighted signals; and a switching module configured to receive the set of weighted signals and at least a portion of 2N periodic control signals, wherein each of the periodic control signals has a period of 2N*Tvco which contains a pulse with a pulse width not greater than Tvco; wherein the pulses of the 2N periodic control signals do not overlap with each other; and whereby the switching module outputs the set of weighted signals cyclically, under the control of the received periodic control signals, to generate an output signal with a frequency shift of m/(2N*Tvco), where Tvco denotes a period of a VCO signal, N and m are integers, 0<m<N, compared with the input signal.

20 Claims, 9 Drawing Sheets

SIGNAL MIXING METHOD AND MIXER

CROSS REFERENCE TO RELATED APPLICATIONS

This application claims priority to Chinese Patent Application Number 201510230841.6 filed on May 7, 2015, the entire content of which is incorporated herein by reference.

TECHNICAL FIELD

The application generally relates to integrated circuits and systems, and more particularly, to a signal mixing method and a mixer.

BACKGROUND

A mixer is an important block of radio frequency (RF) frontend circuits, and has been widely used in transceiver systems. The mixer is used to perform frequency shifting, i.e., to shift the carrier frequency of a desired signal from one frequency to another. For a transmitter, it shifts the desired signal from a low frequency band to a radio frequency band. This process is called as up-mixing or up-conversion. For a receiver, it shifts a desired signal from a radio frequency band to a low frequency band. This process is called as down-mixing or down-conversion.

The mixer performs signal mixing operations based on a local oscillating (LO) signal. In a direct conversion (DC) transceiver (TRX), for the down-conversion operation, the frequency of a received signal is the same as that of the LO signal, while in the up-conversion operation, the frequency of an output signal is the same as that of the LO signal. The LO signal is usually generated by dividing or multiplying the frequency of a voltage control oscillating (VCO) signal. The frequency of the LO signal $f_{LO}$ is N times larger or smaller than that of the VCO signal $f_{VCO}$, i.e. $f_{LO}/f_{VCO}=N$ or $f_{LO}/f_{VCO}=1/N$. Thus, the frequency of the desired signal is N times that of the VCO signal or vice versa, in the direct conversion architecture.

The frequency plan has a severe problem in the DC transceivers, i.e. VCO pulling. VCO pulling occurs when a power amplifier (PA) transmits the output signal (frf) with a frequency the same as the VCO frequency, or the PA harmonic is the same as the VCO frequency or even the VCO harmonic is the same PA signal. When the PA is integrated within the system this situation becomes worse because VCO is disturbed by the PA output and the transmitted signal may be totally destroyed. A common frequency plan in DC transceivers is fvco=2*flo=2*frf, so the quadrature LO signals could be generated by dividing the VCO signal by 2. In such architecture, VCO pulling is inevitable if VCO pulling is not handled carefully.

Thus, there is a need to a signal mixing method to resolve the aforesaid problem.

SUMMARY

An objective of the application is to provide a signal mixing method and a mixer to reduce harmonic interference between a VCO signal and a PA signal.

In a first aspect of the application, there is provided a mixer. The mixer comprises a weighting module configured to receive an input signal, and weight the input signal with a set of weighting factors to generate a set of weighted signals; and a switching module configured to receive the set of weighted signals and at least a portion of 2N periodic control signals. Each periodic control signal has a period of 2N*Tvco, which contains a pulse with a pulse width not greater than Tvco, wherein N is an integer. The pulses of the 2N periodic control signals do not overlap with each other. The switching module cyclically outputs the set of weighted signals, under the control of the received periodic control signals, to generate an output signal having a frequency shift of m/(2N*Tvco), where 0<m<N, as compared with the input signal, and Tvco stands for a period of a VCO signal.

In some embodiments, the switching module comprises a set of switching units, and each switching unit being configured to receive a pair of periodic control signals and one of the set of weighting signals, and to output the weighted signal in response to the pair of periodic control signals.

In some embodiments, the number of the set of switching units is not greater than N.

In some embodiments, each of the set of switching units has an output node for outputting the received weighted signal, and the output nodes of the set of switching units are coupled together.

In some embodiments, the set of weighting factors are selected from a weighting coefficient set or a subset thereof, and the weighting coefficient set is a set of coefficients generated by quantizing a function $$A\cos\left(2\pi m \cdot \frac{i}{2N} + \theta\right) + B \text{ and/or } A\sin\left(2\pi m \cdot \frac{i}{2N} + \theta\right) + B,$$

where i=0, 1, 2, . . . , (2N−1), where A, B and θ are all predefined real numbers.

In some embodiments, the output signal is given by an equation below:

$$V_{out}(t) = V_{IN}(t) \cdot \sum_{j} \sum_{i=0}^{2N-1} k_i p(t - (i + 2Nj) \cdot T_{VC0}),$$

where $V_{IN}(t)$ denotes the input signal, $V_{OUT}(t)$ denotes the output signal, $k_i$ denotes the weighting coefficients given by $$k_i = A\cos\left(2\pi m \cdot \frac{i}{2N} + \theta\right) + B \text{ or } k_i = A\sin\left(2\pi m \cdot \frac{i}{2N} + \theta\right) + B,$$

and p(t) denotes a pulse function, where i=0, 1, 2, . . . , (2N−1).

In some embodiments, the 2N periodic control signals are generated by a local oscillating signal with a period equal to Tvco.

In some embodiments, the weighting module comprises a set of weighting units, and each weighting unit is configured to weight the input signal using with a weighting factor of the set of weighting factors.

In another aspect of the application, there is further provided a mixer. The mixer includes a switching module configured to receive an input signal and at least a portion of 2N periodic control signals. Each periodic control signal has a period of 2N*Tvco which contains a pulse with a width not greater than Tvco, wherein N is an integer. The pulses of the 2N periodic control signals do not overlap with each other. The switching module outputs the set of weighted signals cyclically, under the control of the received periodic control signals. The mixer further includes a weighting module configured to receive the set of weighted signals and to weight the set of weighted signals with a set of weighting factor, so as to generate an output signal having a frequency shift of m/(2N*Tvco) as compared with the input signal, where N and m are integers, and 0<m<N.

In a further aspect of the application, there is further provided a signal mixing method, including: receiving an input signal; weighting the input signal with a set of weighting factors to generate a set of weighted signals; sampling the set of weighted signals with a predefined period of $2N*T_{VCO}$, wherein N is an integer, and each period contains at most 2N sampling pulses with a pulse width not greater than $T_{VCO}$, and the at most 2N sampling pulses do not overlap with each other. Each sampling pulse is for sampling one of the set of weighted signals; and summing the sampled weighted signals to generate an output signal, wherein the output signal has a frequency shift of m/(2N*Tvco) as compared with the input signal, where N and m are integers and 0<m<N.

In a further aspect of the application, there is further provided a signal mixing method, including: receiving an input signal; sampling the input signal with a predefined period of $2N*T_{VCO}$ to generate at most 2N sampled signals, wherein each period contains at most 2N sampling pulses with a pulse width not greater than $T_{VCO}$. The at most 2N sampling pulses do not overlap with each other, and each sampling pulse is for sampling the input signal; weighting the at most 2N sampled signals with a set of weighting factors to generate at most 2N weighted signals; and summing the weighted signals to generate an output signal, wherein the output signal has a frequency shift of m/(2N*Tvco) as compared with the input signal, where N and m are integers and 0<m<N.

The foregoing description has outlined the features of the present application rather broadly. Additional features of the present application will be described, hereinafter, which form the subject of the claims of the present application. It should be appreciated by those skilled in the art that the conception and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

BRIEF DESCRIPTION OF THE DRAWINGS

The aforementioned features and other features of the present application will be further described in the following paragraphs by referring to the accompanying drawings and the appended claims. It will be understood that, these accompanying drawings merely illustrate certain embodiments in accordance with the present application and should not be considered as limitation to the scope of the present application. Unless otherwise specified, the accompanying drawings need not be proportional, and similar reference characters generally denote similar elements.

DETAILED DESCRIPTION OF THE PREFERRED EMBODIMENTS

The following detailed description refers to the accompanying drawings as a part of the present application. Unless otherwise stated in the context, similar symbols generally represent similar components in the accompanying figures. The illustrative embodiments described in the detailed description, the accompanying drawings and the claims are not limiting, and other embodiments may be adopted, or modifications may be made without deviating from the spirit and subject of the application. It should be understood that, the various aspects of the application described and graphically presented herein may be arranged, replaced, combined, divided and designed in many different configurations, and these different configurations are implicitly included in the application.

The inventor of the application has found that, in signal mixing, if there exists frequency multiplication relationship or approximate frequency multiplication relationship between the frequency of an input signal or of a mixed signal, i.e., an output signal generated from the mixing operation, and the frequency of a voltage control oscillating (VCO) signal, harmonic waves of one of the two signals with a lower frequency may be easily coupled with the other signal with a higher frequency, thereby producing interference to the signal with the higher frequency. However, if a frequency shift generated by the signal mixing is set to a non-integer multiple, i.e., a fractional multiple, of the frequency of the VCO signal, then the frequencies of the harmonic waves of the signal with the lower frequency and the VCO signal may not overlap with each other. Thus, fewer harmonic waves may be introduced into the output signal. In the following, some illustrative embodiments are provided to realize the aforesaid inventive concept.

Figure 1:
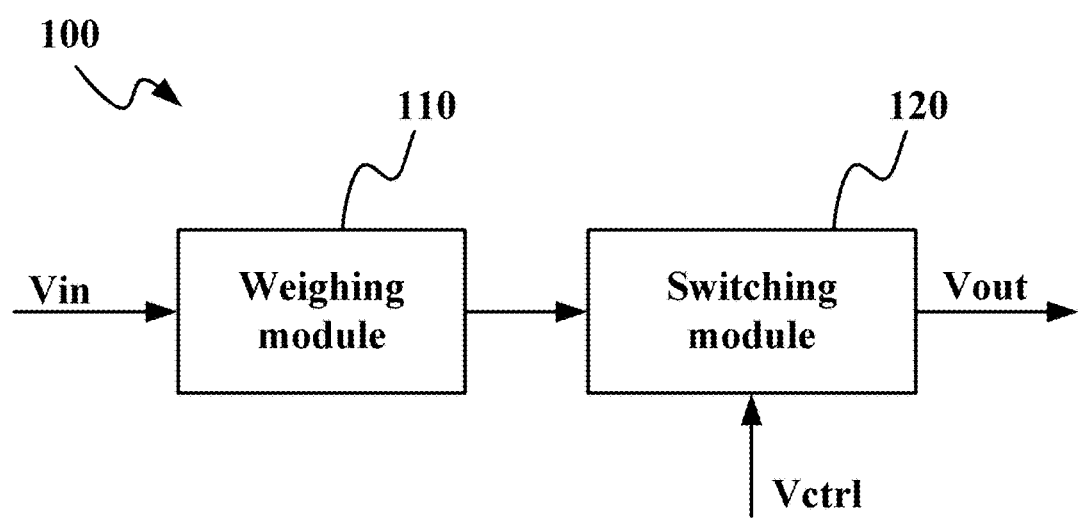
FIG. 1 shows a mixer 100 according to an embodiment of the application.

FIG. 1 shows a mixer 100 according to an embodiment of the application. The mixer 100 is used to receive an input signal $V_{in}$ and to perform a frequency shifting on the input signal $V_{in}$ to generate an output signal $V_{out}$. A frequency difference between the output signal $V_{out}$ and the input signal $V_{in}$ is the frequency shift produced by the mixer 100.

As shown in FIG. 1, the mixer 100 includes a weighting module 110 and a switching module 120.

In particular, the weighting module 110 receives the input signal $V_{in}$ and weights the input signal $V_{in}$ with a set of weighting factors $K_i$ to generate a set of weighted signals. In some embodiments, the weighting module 110 includes a set of weighting units, each of which weights the input signal $V_{in}$ with one of the weighting factors $K_i$. Different weighting units may have different weighting factors. Optionally, the weighting factors of two different weighting units may be the same. In certain embodiments, the weighting unit may be an amplifier such as a trans-conductance amplifier, a trans-impendence amplifier, etc., which may amplify the input signal $V_{in}$ inputted to the mixer 100 with a preset gain, thereby implementing the weighting operation. In some embodiments, the weighting module 110 may generate a weighted signal. In some embodiments, the weighting module 110 may invert the weighted signals during or after the weighting operation, to generate inverting signals of the weighted signals, or to generate both the weighted signals and their inverting signals. In some examples, the mixer may be of a single ended structure, and in some other embodiments, the mixer may be of a differential structure. In the following, the mixer of the present application is exemplarily described with examples where the mixer is of a differential structure. However, such example is not intended to be a limitation.

The switching module 120 receives the set of weighted signals generated by the weighting module 110. Moreover, the switching module 120 further receives a set of periodic control signals $V_{ctrl}$. The periodic control signals $V_{ctrl}$ are selected from 2N periodic control signals, where N is an integer. For example, at least a portion of the 2N periodic control signals are provided to the switching module 120 to control the conducting state of the signal path of the switching module 120, such that the switching module 120 may allow the set of received weighted signals to pass through selectively. The periodic control signals control sampling of the weighted signals by prohibiting or allowing the passage of the weighted signals. In particular, each periodic control signal $V_{ctrl}$ has a period of $2N*T_{VCO}$, and each period contains a pulse with a pulse width not greater than $T_{VCO}$. In some embodiments, a multi-stage shift register may be used to process a VCO signal to generate the 2N periodic control signals with consecutive pulses. Tvco denotes a period of the VCO signal. Accordingly, the frequency of the VCO signal is referred to as $f_{VCO}$, which is equal to $1/T_{VCO}$.

The switching control module 120 may have a set of switching units. In some embodiments, each of the switching units receives a pair of periodic control signals $V_{ctrl}$, and a weighted signal or its inverting signal or both the weighted signal and its inverting signal. In some embodiments, the weighted signal may be multiplexed, i.e., the weighted signal and/or its inverting signal may be provided to one or more switching units. Moreover, the number of switching units included in the switching module 120 is equal to the number of the pairs of the periodic control signals $V_{ctrl}$. Under the control of the received periodic control signals $V_{ctrl}$, each of the switching units generates a weighted signal and/or its inverting signal cyclically. Then the switching module 120 may have at most N switching units. In other embodiments, each of the switching units receives a periodic control signal, and a weighted signal or its inverting signal. Accordingly, the switching module 120 may have at most 2N switching units.

In some embodiments, the pulses of the 2N periodic control signals do not overlap with each other, such that the set of periodic control signals $V_{ctrl}$ received by the switching control module 120, which are at least a portion of the 2N periodic control signals, do not overlap with each other either. Therefore, the set of switching units of the switching module 120 may not output signals simultaneously, i.e, only one of the set of weighted signals and/or its inverting signal can pass through the switching module 120 at one time.

In some embodiments, the set of weighting factors of the weighting module 110 are selected from a weighting coefficient set or a subset thereof. The weighting coefficient set is a set of coefficients generated by quantizing a function $$A\cos\left(2\pi m \cdot \frac{i}{2N} + \theta\right) + B \text{ and/or } A\sin\left(2\pi m \cdot \frac{i}{2N} + \theta\right) + B,$$

where i=0, 1, 2, ..., (2N−1), and parameters A, B and θ are real numbers. The values of parameters A, B and θ may be determined according to the specific quantization method used for generating the weighting coefficient set.

Accordingly, the output signal $V_{out}$ may be given by Equation (1):

$$V_{out}(t) = V_{IN}(t) \cdot \sum_j \sum_{i=0}^{2N-1} k_i p(t - (i + 2Nj) \cdot T_{VC0}) \quad (1)$$

where $V_{IN}(t)$ denotes the input signal, $V_{OUT}(t)$ denotes the output signal, $k_i$ denotes the weighting coefficients, p(t) denotes a pulse function, and i=0, 1, 2, ..., (2N−1). The value of the pulse function p(t) is nonzero when $0 \le t < T_p$, and is zero otherwise. $T_p$ denotes the pulse width of the pulse function p(t), where $0 < T_p \le T_{VCO}$. The pulse function p(t) corresponds to the pulse of the received periodic control signal $V_{ctrl}$. j is an integer which denotes that the periodic control signal is repeated at the period of $2N*T_{VCO}$. Over an entire time period of $2N*T_{VCO}$, the sum of the weighted signals corresponds to an analogue or approximation to a signal having a frequency shift compared with the input signal. When the pulses of the 2N periodic control signals do not overlap and have an equal pulse width, the sample value of the output signal is equal to the value of the weighted signal during each pulse, so that the expression $$A\cos\left(2\pi m \cdot \frac{i}{2N} + \theta\right) + B \text{ and/or } A\sin\left(2\pi m \cdot \frac{i}{2N} + \theta\right) + B$$

may be used to calculate the corresponding weighting factors. It will be appreciated that if the pulses of different periodic control signals have different pulse widths, the sampling intervals for different periodic control signals are different from each other. In this case, the weighting factors may be calculated based on the specific pulse width and the expressions as $$A\cos\left(2\pi m \cdot \frac{i}{2N} + \theta\right) + B \text{ and/or } A\sin\left(2\pi m \cdot \frac{i}{2N} + \theta\right) + B.$$

In the following, certain embodiments are provided based on the assumption that the pulses of the 2N periodic control signals do not overlap with each other and have an equal pulse width. However, this is not intended to limit the scope of the present invention. A skilled artisan in the art may adjust and determine the weighting factors and the pulses according to practical requirements.

In some examples, the set of weighting coefficients $k_i$ may be given by Equation (2) as follows:

$$k_i = Q\left\{A \cdot \cos\left(2\pi \cdot m \cdot \frac{i}{2N} + \theta\right) + B\right\} \quad (2)$$

where m is a predefined positive integer, and θ denotes an initial phase which may be selected from a range [0, 2π] according to actual needs. A denotes a signal amplitude used to generate the weighting coefficients with desired precision; and B denotes a direct current (DC) adjustment parameter. When a single-ended circuit is used to implement the mixer 100, the set of weighting coefficients $k_i$ may be adjusted to a non-negative value by properly setting the value of parameter B. When a double-balanced circuit is used to implement the mixer 100, parameter B may be set to 0.

The weighting coefficients $k_i$ are generally set as integers for the purpose of simplicity. In this case, the signal amplitude A should be determined properly. In the following, Q{•} represents quantization operation, which is, in particular, to perform a quantization operation on the value or the expression in the brackets, and the quantization operation can convert a cosine value or some other non-integer value into a value which is easier for implementation.

Parameters A, B and the quantization operation Q{•} may be determined to achieve a trade-off between complexity and performance. For example, the quantization operation Q{•} may be a convert-to-integer operation which may include down conversion (i.e., the converted value is the maximum integer not greater than the value to be converted), up conversion (i.e., the converted value is the minimum integer no less than the value to be converted), rounded conversion (i.e., the converted value is the nearest integer to the value to be converted), or other convert-to-integer operations based on practical requirements. For example, in order to reduce the hardware complexity in implementation, the converted value is a value closest to the value to be converted which can be expressed as a sum of several integer powers of 2. In some embodiments, the quantization operation may also be an operation other than the convert-to-integer operation. For example, the quantized value may be a fractional number which is easy to be implemented. When the weighting coefficients are integers, the value of the amplitude A should not be too small, otherwise, the quantization precision of the weighting coefficients may be insufficient, causing a relatively large error. Generally, the larger the value of the amplitude A is, the higher the quantization precision is. However, the larger the weighting coefficient is, the larger the signal is amplified, and thus the requirement for the weighting module is higher. Therefore, the value of the amplitude A needs to be chosen properly considering the trade-off between quantization precision and circuit complexity. As to the initial phase θ, it can be any value between 0 and 2π theoretically. However, in order to reduce the number of weighting units and circuit complexity, an appropriate initial phase θ may be chosen to generate as many zero-value weighting coefficients as possible, or to generate as many weighting coefficients with the same value or same absolute value as possible.

The sum of the weighted signals and/or their inverting signals which are selectively passed through the switching module 120 forms the output signal $V_{out}$. In certain embodiments, a summing module may be provided to sum the signals outputted at output nodes of the switching units of the switching module 120 to generate the output signal $V_{out}$. For example, the associated output nodes of the set of weighting units may be coupled together. In other words, if the weighting units are single-ended output circuits, their output nodes can be coupled together. Moreover, if the weighting units are differential output or double-ended output circuits, their positive and negative output nodes are coupled together, respectively.

Compared with the input signal $V_{in}$, the output signal $V_{out}$ has a frequency shift equal to m/(2N*Tvco), where m is an integer, and 0<m<N. The values of N and m may be selected based on the required fractional frequency or multiple frequency according to applications. For example, if the frequency shift or frequency difference between the output signal $V_{out}$ and the input signal $V_{in}$ is required to be $5/(8T_{VCO})$, then N is set to 4 and m is set to 5.

When the mixer 100 is used for up conversion, the signal inputted to the mixer 100 is generally with a relatively low frequency, thus the frequency of the output signal $V_{out}$ is roughly equal to $f_{VCO}*5/8$. Therefore, the higher frequency harmonics of the output signal will not overlap with the VCO signal, i.e., the VCO pulling will not occur, which significantly improves the quality of the output signal of the mixer 100. Similarly, when the mixer 100 is used for down conversion, the VCO pulling can also be avoided.

As stated above, in applications, due to different values of the parameters m and N in the frequency shift $f_{VCO}*m/2N$ and different circuit implementations, the circuit coupling between the weighting module 110 and the switching module 120 may be different. The structure and operation of the mixer according to the present application will be further illustrated below with references to detailed circuit embodiments.

Figure 2:
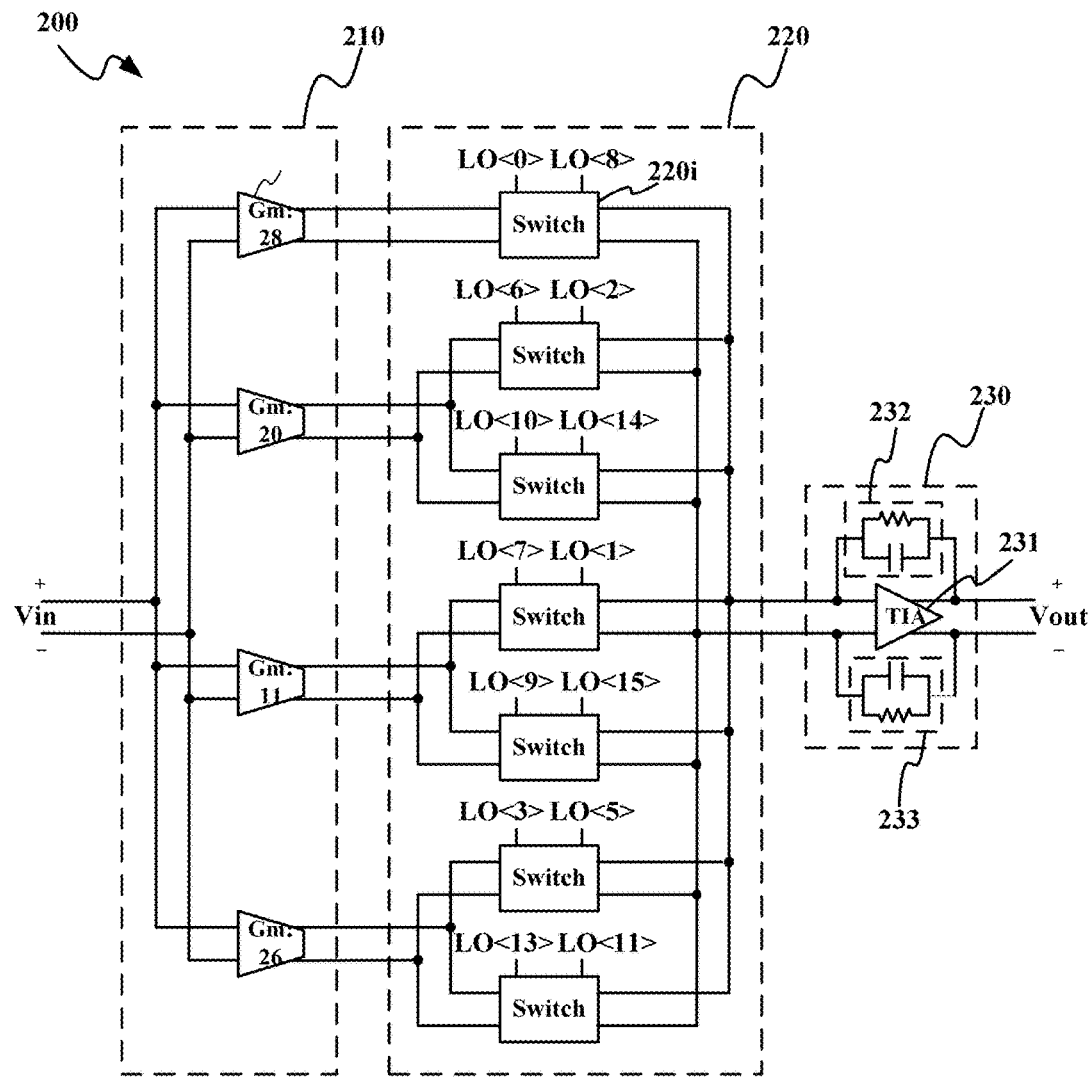
FIG. 2 shows a mixer 200 according to an embodiment of the application.

FIG. 2 shows a schematic diagram of a double-balanced mixer 200 according to an embodiment of the application. The differential mixer 200 is used to receive a differential input signal $V_{in}$ and to shift its frequency, thereby generating a differential output signal $V_{out}$.

As shown in FIG. 2, the mixer 200 includes a weighting module 210 and a switching module 220.

In particular, the weighting module 210 includes a set of weighting units 210i, and each of the weighting units 210i has a pair of differential input nodes for receiving the differential input signal $V_{in}$. Each of the weighting units 210i weights the input signal $V_{in}$ with a weighting factor, and outputs a weighted signal at its differential output nodes. It can be understood by an artisan in the art that when the input signal $V_{in}$ is a single-ended signal, a single-end to double-end signal converter may be utilized to convert the single-ended signal into a differential signal, and then the weighting operation by the weighting modules 210 can be performed. Moreover, a double-end to single-end signal converter may also be used at the output nodes of the mixer 200 to convert the differential signal into a single-ended signal.

As stated above, the number of the weighting units 210i included in the weighting module 210 and the specific values of their weighting factors depend on the frequency shift $f_{VCO}*m/2N$ produced by the mixer 200. The weighting factor of each weighting unit 210i is selected from a weighting coefficient set or its subset. The weighting coefficient set is a coefficient set generated by quantizing a function as $$A\cos\left(2\pi m \cdot \frac{i}{2N} + \theta\right) + B$$

and/or a function as $$A\sin\left(2\pi m \cdot \frac{i}{2N} + \theta\right) + B,$$

where i=0, 1, 2, . . . , (2N−1), and A, B and θ are all predefined real numbers.

Table 1 illustrates weighting factors calculated for different values of m when N=8, where parameters B and θ are both set to 0. Moreover, with consideration of quantization precision and complexity in circuit implementation, parameter A is set to 28 and the "nearest integer" quantizing method is used to generate the corresponding integer weighting factors. The abbreviation "Inp" in Table 1 indicates that the results are calculated based on function $$A\cos\left(2\pi m \cdot \frac{i}{2N} + \theta\right) + B,$$

and the abbreviation "Quad" indicates that the results are calculated based on function $$A\sin\left(2\pi m \cdot \frac{i}{2N} + \theta\right) + B.$$

the weighting units may not be necessary. In other words, for each non-zero weighting coefficient, a weighting unit with a corresponding weighting factor may be provided to generate the corresponding weighted signal.

The mixer shown in FIG. 2 may be used to mix the real input signal $V_{in}$. In this case, the weighting coefficient set may be selected from a coefficient set generated by quantizing the function $$A\cos\left(2\pi m \cdot \frac{i}{2N} + \theta\right) + B$$

(corresponding to the coefficient sets "Inp" in Table 1) or $$A\sin\left(2\pi m \cdot \frac{i}{2N} + \theta\right) + B$$

(corresponding to the coefficient sets "Quad" in Table 1). It will be appreciated by an artisan in the art that, when the input signal $V_{in}$ is a complex signal, the mixer 200 illustrated in FIG. 2 may be used to process an inphase component and

TABLE 1

| m | i | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|----|----|----|----|----|----|
| 1 | Inp | 28 | 26 | 20 | 11 | 0 | −11 | −20 | −26 | −28 | −26 | −20 | −11 | 0 | 11 | 20 | 26 |
|   | Quad | 0 | 11 | 20 | 26 | 28 | 26 | 20 | 11 | 0 | −11 | −20 | −26 | −28 | −26 | −20 | −11 |
| 2 | Inp | 28 | 20 | 0 | −20 | −28 | −20 | 0 | 20 | 28 | 20 | 0 | −20 | −28 | −20 | 0 | 20 |
|   | Quad | 0 | 20 | 28 | 20 | 0 | −20 | −28 | −20 | 0 | 20 | 28 | 20 | 0 | −20 | −28 | −20 |
| 3 | Inp | 28 | 11 | −20 | −26 | 0 | 26 | 20 | −11 | −28 | −11 | 20 | 26 | 0 | −26 | −20 | 11 |
|   | Quad | 0 | 26 | 20 | −11 | −28 | −11 | 20 | 26 | 0 | −26 | −20 | 11 | 28 | 11 | −20 | −26 |
| 4 | Inp | 28 | 0 | −28 | 0 | 28 | 0 | −28 | 0 | 28 | 0 | −28 | 0 | 28 | 0 | −28 | 0 |
|   | Quad | 0 | 28 | 0 | −28 | 0 | 28 | 0 | −28 | 0 | 28 | 0 | −28 | 0 | 28 | 0 | −28 |
| 5 | Inp | 28 | −11 | −20 | 26 | 0 | −26 | 20 | 11 | −28 | 11 | 20 | −26 | 0 | 26 | −20 | −11 |
|   | Quad | 0 | 26 | −20 | −11 | 28 | −11 | −20 | 26 | 0 | −26 | 20 | 11 | −28 | 11 | 20 | −26 |
| 6 | Inp | 28 | −20 | 0 | 20 | −28 | 20 | 0 | −20 | 28 | −20 | 0 | 20 | −28 | 20 | 0 | −20 |
|   | Quad | 0 | 20 | −28 | 20 | 0 | −20 | 28 | −20 | 0 | 20 | −28 | 20 | 0 | −20 | 28 | −20 |
| 7 | Inp | 28 | −26 | 20 | −11 | 0 | 11 | −20 | 26 | −28 | 26 | −20 | 11 | 0 | −11 | 20 | −26 |
|   | Quad | 0 | 11 | −20 | 26 | −28 | 26 | −20 | 11 | 0 | −11 | 20 | −26 | 28 | −26 | 20 | −11 |

Referring to Table 1 and taking m=5 as an example, there are 16 elements in the weighting coefficient set, i.e., {$k_i$}={28, −11, −20, 26, 0, 26, 20, 11, −28, 11, 20, −26, 0, 26, −20, −11}, where i=0, 1, 2, . . . , 15. It can be seen that, the weighting coefficient set includes five absolute values, i.e., 0, 11, 20, 26 and 28. The weighting coefficient "0" means that no signal is required to pass through the post-stage switching module 220. Therefore, in applications, only four weighting units 210i are required for the weighting module 210. The weighting factors of the four weighting units 210i are 11, 20, 26 and 28, respectively. As to the negative weighting factors, they can be implemented by inverting the output signals of the weighting units 210i. No additional weighting unit is required. It will be appreciated that, inversion of the weighted signals may also be implemented by a switching module having a differential circuit structure.

Still taking the example of weighting coefficients corresponding to m=5, since the weighting coefficient "11" corresponds to multiple values in Table 1, i.e., $k_1$, $k_7$, $k_9$ and $k_{15}$, the weighted signal generated by the weighting unit having the weight factor of "11" may be multiplexed in actual circuit implementation. The multiplexing of the weighted signals and the coupling of the weighting module 220 will be elaborated in the following paragraphs. It will be appreciated by an artisan in the art that, the multiplexing of a quadrature component of the complex signal separately, to generate the output signal. Accordingly, the weighting factors of various weighting units for processing the inphase component may be selected from the "Inp" coefficient set, which is generated by quantizing the function $$A\cos\left(2\pi m \cdot \frac{i}{2N} + \theta\right) + B,$$

and the weighting factors of various weighting units for processing the quadrature component may be selected from the "Quad" coefficient set, which is generated by quantizing the function $$A\sin\left(2\pi m \cdot \frac{i}{2N} + \theta\right) + B.$$

Still referring to FIG. 2, the switching module 220 has a set of switching units 220i, and each of the switching units 220i receives a pair of periodic control signals and a weighted signal or its inverting signal.

Specifically, the control signal received by each switching unit 220i is selected from a group of 2N periodic control signals. The control signals received by the switching unit 220$i$ are different from each other, and the signals of the pair of periodic control signals received by each switching unit 220$i$ are also different from each other. Each periodic control signal has a period of 2N*T$_{VCO}$. Each period contains a pulse with a pulse width of Tp, where Tp may be a value greater than 0 but less than T$_{VCO}$.

Figure 3:
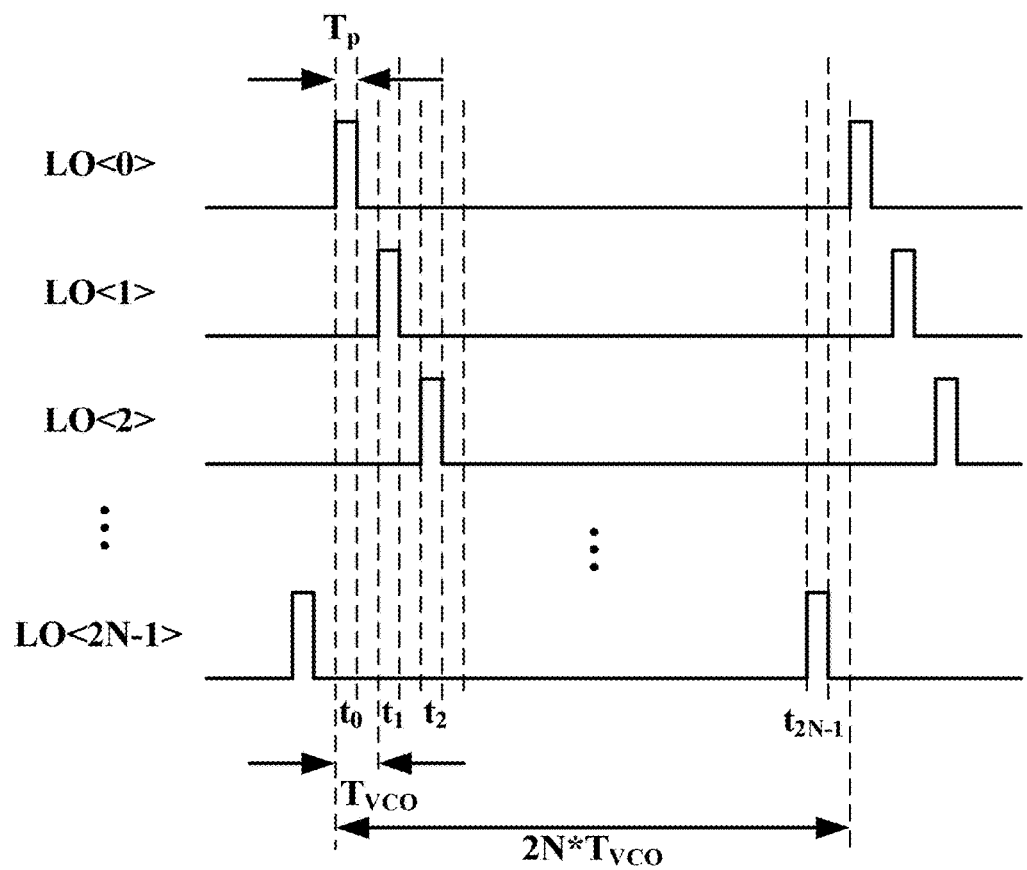
FIG. 3 shows control signals according to an embodiment of the application.

FIG. 3 shows exemplary waveforms of control signals according to an embodiment of the application.

As shown in FIG. 3, pulses of 2N control signals (LO<0>, LO<1>, LO<2N-1>) do not overlap with each other. The control signal LO$_{i+1}$ may be generated by delaying the control signal LO$_i$ by a time interval of T$_{VCO}$. Enabling periods of the pulses of the periodic control signals are t$_0$, t$_1$, . . . t$_{2N-1}$, respectively. Although the pulses of the control signals shown in FIG. 3 are square waves, it is not intended to limit to the scope of the present application. It can be understood by an artisan in the art that, the pulses may be pulses other than square waves, provided that they can control the switching units to output the received weighted signals and/or the inverting signals of the weighted signals, while the switching units do not output these signals simultaneously. Under the control of the control signals, the switching units 220$i$ function as sampling circuits. During the enabling period of a periodic control signal, the weighted signal and/or its inverted signal is sampled.

Figure 4:
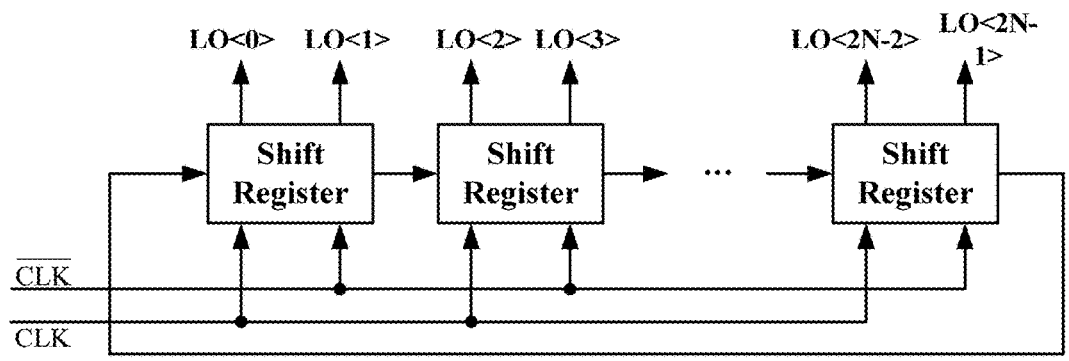
FIG. 4 shows a circuit for generating control signals according to an embodiment of the application.

When Tp=Tvco, the control signals may be generated by the circuit as shown in FIG. 4.

As stated above, according to the calculation of the weighting coefficients, the one or more weighted signals generated by the weighting module 210 may be multiplexed, or specifically, a weighted signal may be provided for a set of switching units. Therefore, the certain relationship between a weighting factor of a weighting unit and a control signal received by a switching unit that receives a weighted signal generated by the weighting unit may be determined according to Equation (1). The weighting coefficient k$_i$ in Equation (1) indicates the variation in amplitude and phase of the signal generated by the switching unit after the input signal V$_{in}$ being processed by a specific weighting unit and a specific switching unit during the enabling period t$_i$. as compared to the signal inputted to the switching unit.

The amplitude weighting of the input signal V$_{in}$ is implemented by the weighting module 210. The gating and inverting of the weighted signals are implemented by the switching module 220. Each switching unit 220$i$ of the switching module 220 has a positive input node and a negative input node for receiving control signals. The positive input terminal receives a periodic control signal that controls the switching unit to generate the weighted signal received by the switching unit. Moreover, the negative input node receives a periodic control signal that controls the switching unit to generate an inverting signal of the weighted signal received by the switching unit.

The implementation of the mixer 200 shown in FIG. 2 will be illustrated by taking m=5, N=8 as the example. Moreover, working process of the mixer 200 during a period of the control signals will be elaborated with reference to the switching signals shown in FIG. 3. An artisan in the art will conceive examples with other values of m and N according to this example.

If m=5, N=8, the set of weighting factors of the weighting units 210$i$ of the weighting module 210 may be selected from the in-phase or quadrature coefficients corresponding to m=5 in Table 1, for example, the in-phase coefficients. In this case, since there are 14 non-zero weighting coefficients (some are opposite numbers), at least 7 switching units 220$i$ are required. In addition, since the non-zero in-phase coefficients have only four different values, i.e., 28, 11, 20 and 26, the weighting module 210 may have at least four weighting units to provide the corresponding weighting factors.

During an enabling period t$_0$, the switching unit that receives the switching control signal LO<0> receives a weighted signal S$_w$(t)=|k$_0$|V$_{in}$(t)=28V$_{in}$(t). Since the control signal LO<0> is received by the switching unit at its positive input node, under the control of the pulse of LO<0>, the output of the mixer 200 is V$_{out}$(t)=V$_w$(t)=28V$_{in}$(t) while the other switching units are cut off. During an enabling period t$_1$, the switching unit that receives the switching control signal LO<1> receives a weighted signal S$_w$(t)=|k$_1$|V$_{in}$(t)= 11V$_{in}$(t). Since the control signal LO<1> is received by the switching unit at its negative input node, under the control of the pulse of LO<1>, the output of the mixer 200 is V$_{out}$(t)=−V$_w$(t)=k$_1$V$_{in}$(t)=−11V$_{in}$(t). Similarly, during an enabling period t$_2$, the switching unit that receives the switching control signal LO<2> receives a weighted signal V$_w$(t)=|k$_2$|V$_{in}$(t)=20V$_{in}$(t) and the output of the mixer 200 is V$_{out}$(t)=−V$_w$(t)=k$_2$V$_{in}$(t)=−20V$_{in}$(t).

Figure 5:
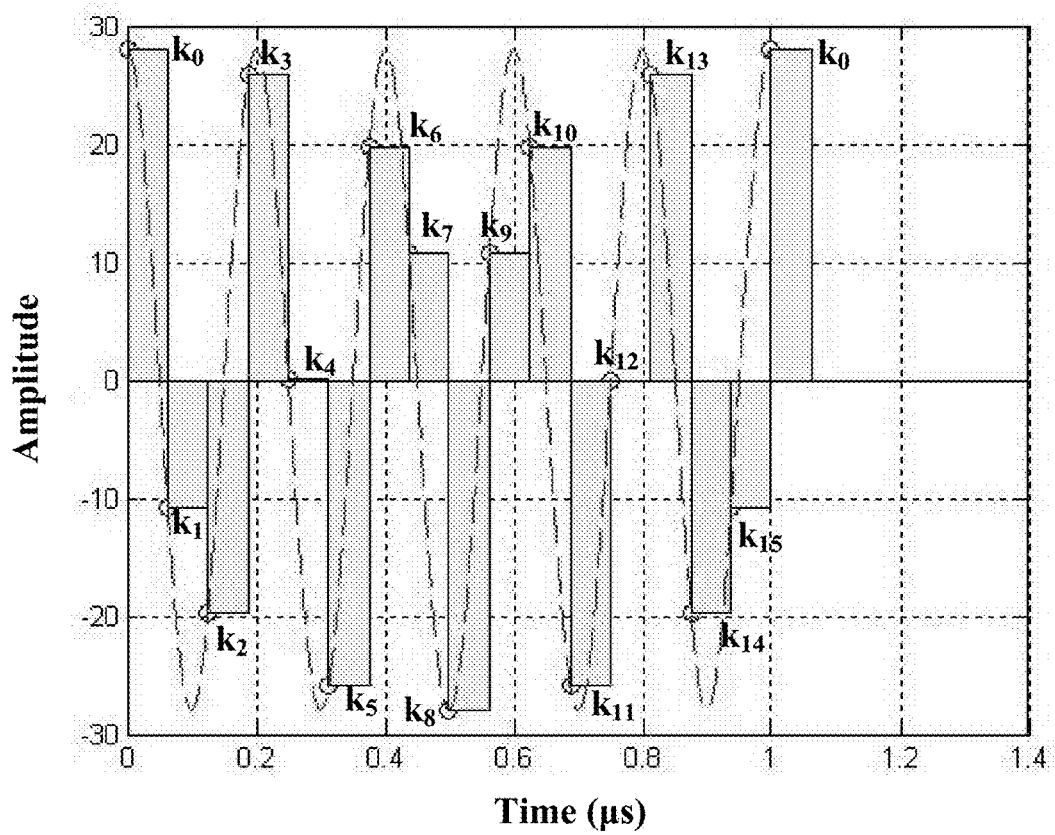
FIG. 5 shows a weighted signal waveform determined by the relationship between weighting coefficients $k_i$ and time, when m=5, N=8, $T_{VCO}=1/16$ μs, $T_p=T_{VCO}$.

FIG. 5 shows a waveform of the weighted signals $$Vp(t) = \sum_{j} \sum_{i=0}^{15} k_i p(t - (i + 16j) \cdot T_{VC0})$$

determined by the weighting coefficients k$_i$ when m=5, N=8, T$_{VCO}$=1/16 μs, and T$_p$=T$_{VCO}$, where the pulse function p(t) is equal to "1" during the time period [0, T$_{VCO}$) and equal to "0" during other time periods. The output signal V$_{out}$(t) is essentially a multiplication of the input signal V$_{in}$(t) and a weighted signal waveform V$_p$(t), i.e., V$_{out}$(t)=V$_{in}$*V$_p$(t).

The sum of the output signals of the switching units 220$i$ forms the output signal V$_{out}$ generated by the mixer 200. In the embodiment shown in FIG. 2, the mixer 200 also has a trans-impendence amplifier (TIA) 230. The TIA 230 is coupled to the output nodes of the switching module for current-voltage conversion. The TIA 230 corresponds to the trans-conductance amplifiers used in the weighting units. In particular, the TIA 230 converts the output signal generated by the switching module from current form into voltage form so that it can be used by the post-stage signal processing circuits.

After being processed as described above, the output signal V$_{out}$ generated by the mixer 200 comprises a signal component after shifting the frequency of the input signal V$_{in}$ by m/(2N*Tvco)=5/(16*T$_{VCO}$) i.e., the signal component corresponding to a fractional mixing result of the input signal V$_{in}$.

It should be noted that, in the embodiment shown in FIG. 2, the inversion of the weighted signals is implemented by the switching module 220. However, it can be understood that, the amplitude weighting and phase inversion of the input signal $V_{in}$ may also be implemented by the weighting module, and the gating of the weighted signals may be implemented by the switching module. Accordingly, the switching units of the switching module do not need to generate the inverting signals of the weighted signals received thereby.

Figure 6:
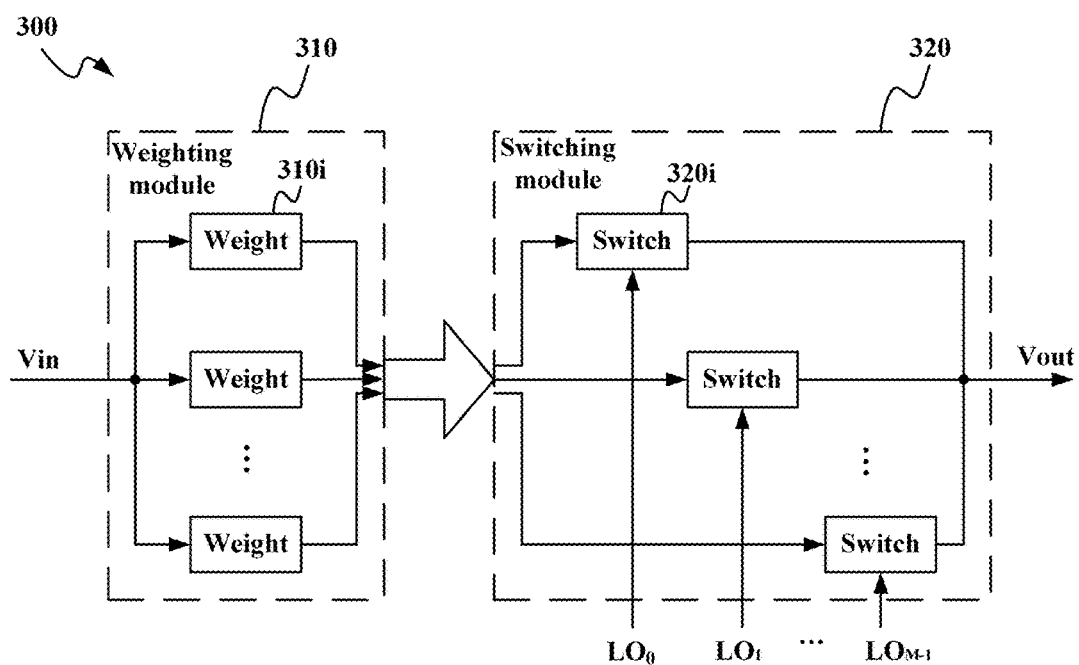
FIG. 6 shows a mixer 300 according to an embodiment of the application.

FIG. 6 shows a schematic diagram of a single-balanced mixer 300 according to an embodiment of the application.

As shown in FIG. 6, the mixer 300 includes a weighting module 310 and a switching module 320. Compared with the mixer shown in FIG. 2, each switching unit 320$i$ of the switching module 320 receives only a single control signal. The weighting module 310 performs weighting operation on the input signal, or alternatively further inverts the weighted signal. Each switching unit 320$i$ outputs the weighted signal it receives under the control of the received control signal.

In some embodiments, the inversion of the weighted signals may be avoided by selecting the value of parameter B properly such that all of the weighting coefficients $k_i$ derived by Equation (2) are non-negative values. This can be achieved by selecting values satisfying B≥A. For simplicity, B may be set equal to A. Table 2 illustrates parameters calculated for different values of m when N=8, where A=28, B=28, θ=0 and an integer rounding method is used. The abbreviation "Inp" in Table 2 indicates results calculated based on function $$A\cos\left(2\pi m \cdot \frac{i}{2N} + \theta\right) + B,$$

the abbreviation "Quad" indicates results calculated based on function $$A\sin\left(2\pi m \cdot \frac{i}{2N} + \theta\right) + B.$$

It can be understood that, although the step of signal inversion is avoided by proper selection of weighting coefficients, the output signal $V_{out}(t)$ of the mixer 300 includes the component of the input signal $V_{in}(t)$. Since the input signal $V_{in}(t)$ and the expected output signal are generally within different frequency bands, a filter may be used to filter the output signal $V_{out}(t)$ of the mixer 300 to separate the expected output signal from the output signal $V_{out}(t)$.

Figure 7:
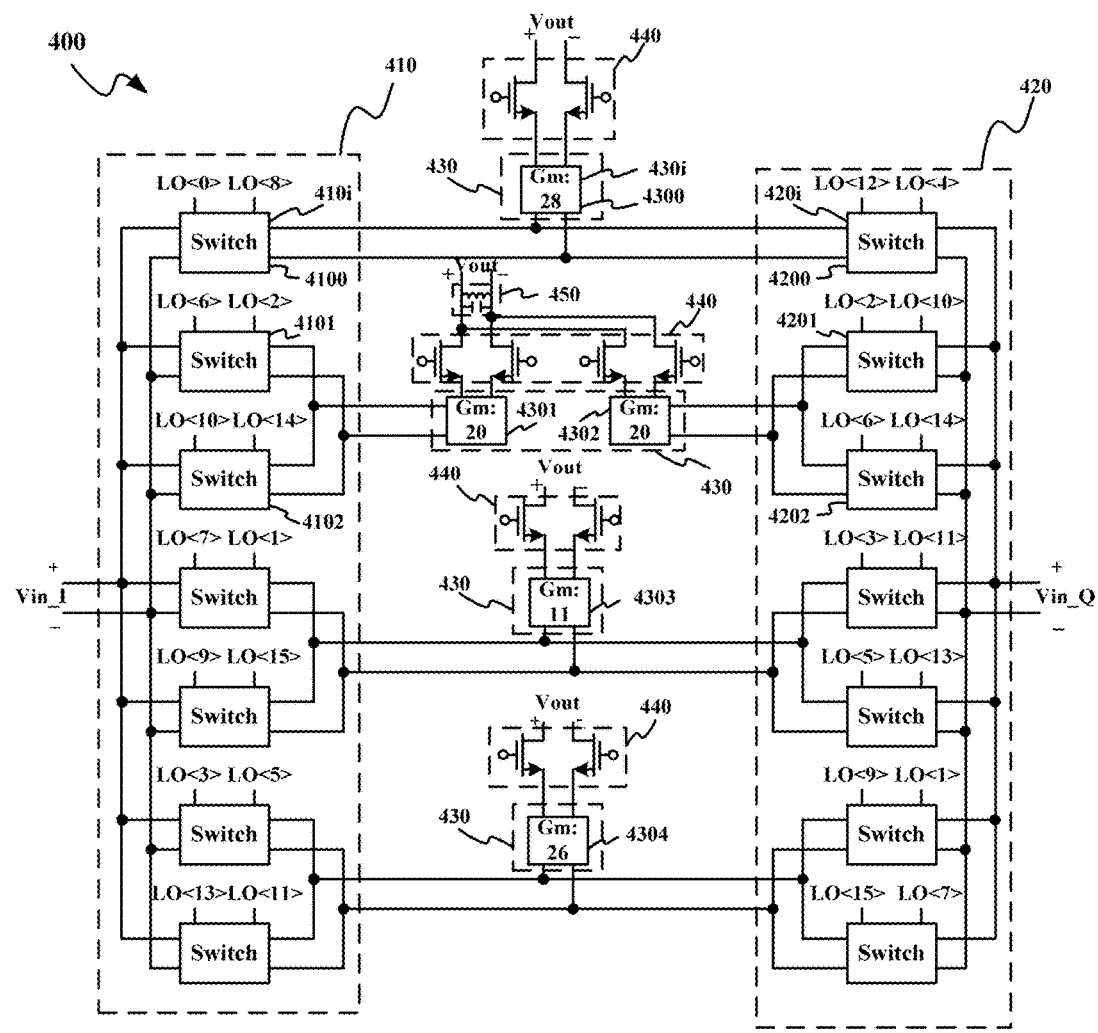
FIG. 7 shows a mixer 400 according to an embodiment of the application.

FIG. 7 FIG. 7 shows a schematic diagram of a mixer 400 according to an embodiment of the application.

As shown in FIG. 7, different from the real signal mixer shown in FIGS. 2 and 5, the mixer 400 shown in FIG. 7 is a complex signal mixer. Specifically, the mixer 400 has a first switching module 410 and a second switching module 420, which correspond to the in-phase weighting coefficients and the quadrature weighting coefficients shown in Table 1, respectively. In addition, the mixer 400 also has a weighting module 430 to perform weighting operation on signals passed by the first and second switching modules 410 and 420 selectively.

Specifically, the first switching module 410 has a set of switching units 410$i$, and each of the switching units 410$i$ has a pair of differential input nodes and a pair of differential output nodes. The corresponding differential input nodes of the switching units 410$i$ are coupled with each other for receiving an in-phase component $V_{in\_}I(t)$ of a differential input signal $V_{in}(t)$. Each of the switching units 410$i$ has a positive input node and a negative input node for receiving control signals. The positive input node receives a periodic control signal that controls the switching unit to generate the in-phase component $V_{in\_}I(t)$ of the input signal $V_{in}(t)$ received by the switching unit at its differential output nodes. The negative input node receives a periodic control signal that controls the switching unit to generate an inverting signal of the in-phase component $V_{in\_}I(t)$ of the input signal $V_{in}(t)$ received by the switching unit at its differential output nodes.

Similar to the first switching module 410, the second switching module 420 has a set of switching units 420$i$. The difference is that the second switching module 420 is used to receive a quadrature component $V_{in\_}Q(t)$ of the input signal $V_{in}(t)$. Under the control of the periodic control signals, each of the switching units 420$i$ outputs the quadrature component $V_{in\_}Q(t)$ of the input signal $V_{in}(t)$ or an inverting signal thereof.

The weighting module 430 has a set of weighting units 430$i$. Each of the weighting units 430$i$ weights the input signal or its inverting signal with a weighting factor, and outputs the weighted signal at its differential output nodes.

Similar to the mixer 200 in FIG. 2, the weighting of each weighting unit is selected from a coefficient set generated by quantizing a function

TABLE 2

| m | i | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|----|----|----|----|----|----|
| 1 | Inp | 56 | 54 | 48 | 39 | 28 | 17 | 8 | 2 | 0 | 2 | 8 | 17 | 28 | 39 | 48 | 54 |
|   | Quad | 28 | 39 | 48 | 54 | 56 | 54 | 48 | 39 | 28 | 17 | 8 | 2 | 0 | 2 | 8 | 17 |
| 2 | Inp | 56 | 48 | 28 | 8 | 0 | 8 | 28 | 48 | 56 | 48 | 28 | 8 | 0 | 8 | 28 | 48 |
|   | Quad | 28 | 48 | 56 | 48 | 28 | 8 | 0 | 8 | 28 | 48 | 56 | 48 | 28 | 8 | 0 | 8 |
| 3 | Inp | 56 | 39 | 8 | 2 | 28 | 54 | 48 | 17 | 0 | 17 | 48 | 54 | 28 | 2 | 8 | 39 |
|   | Quad | 28 | 54 | 48 | 17 | 0 | 17 | 48 | 54 | 28 | 2 | 8 | 39 | 56 | 39 | 8 | 2 |
| 4 | Inp | 56 | 28 | 0 | 28 | 56 | 28 | 0 | 28 | 56 | 28 | 0 | 28 | 56 | 28 | 0 | 28 |
|   | Quad | 28 | 56 | 28 | 0 | 28 | 56 | 28 | 0 | 28 | 56 | 28 | 0 | 28 | 56 | 28 | 0 |
| 5 | Inp | 56 | 17 | 8 | 54 | 28 | 2 | 48 | 39 | 0 | 39 | 48 | 2 | 28 | 54 | 8 | 17 |
|   | Quad | 28 | 54 | 8 | 17 | 56 | 17 | 8 | 54 | 28 | 2 | 48 | 39 | 0 | 39 | 48 | 2 |
| 6 | Inp | 56 | 8 | 28 | 48 | 0 | 48 | 28 | 8 | 56 | 8 | 28 | 48 | 0 | 48 | 28 | 8 |
|   | Quad | 28 | 48 | 0 | 48 | 28 | 8 | 56 | 8 | 28 | 48 | 0 | 48 | 28 | 8 | 56 | 8 |
| 7 | Inp | 56 | 2 | 48 | 17 | 28 | 39 | 8 | 54 | 0 | 54 | 8 | 39 | 28 | 17 | 48 | 2 |
|   | Quad | 28 | 39 | 8 | 54 | 0 | 54 | 8 | 39 | 28 | 17 | 48 | 2 | 56 | 2 | 48 | 17 |

$$A\cos\left(2\pi m \cdot \frac{i}{2N} + \theta\right) + B$$

or function $$A\sin\left(2\pi m \cdot \frac{i}{2N} + \theta\right) + B,$$

where i=0, 1, 2, . . . , (2N−1), and A, B and θ are all predefined real numbers. Similarly, the certain relationship between the weighting factor of the weighting unit and the control signal received by the switching unit that generates the input signal or its inverting signal received thereby, may be determined by Equations (1) and (2) which will not be elaborated herein.

When θ=0 and B=0, the coefficient set generated by quantizing function $$A\cos\left(2\pi m \cdot \frac{i}{2N} + \theta\right) + B$$

is identical to that generated by quantizing function $$A\sin\left(2\pi m \cdot \frac{i}{2N} + \theta\right) + B.$$

If an output signal generated by a switching unit of the first switching module 410 and another output signal generated by a switching unit of the second switching module 420 are to be weighted with the same weighting factor, and the two switching units do not output the signals simultaneously, their output nodes may be coupled together and a single weighting unit may be used to weight their respective output signals. However, if the two switching units output the signals simultaneously, their output terminals may not be coupled together even though their output signals are to be weighted with the same weighting factor.

As shown in FIG. 7, the signals received by the weighting unit 4300 with a weighting factor "28" are from a switching unit 4100 of the first switching module 410 and a switching unit 4200 of the second switching module 420, respectively. The control signals received by the switching unit 4100 are LO<0> and LO<8>, and the control signals received by the switching unit 4200 are LO<12> and LO<4>. The control signals received by the two switching units are different, thus the two switching units will not output signals simultaneously, and their output nodes may be coupled together to the input nodes of the weighting unit 4300.

However, for the weighting factor "20", the output nodes of the switching units 4101 and 4102 of the first switching module 410 are coupled together, and the output nodes of the switching units 4201 and 4202 of the second switching module 420 are coupled together. Since the switching units 4101, 4102 and the switching units 4201, 4202 receive the same group of control signals LO<6>, LO<2>, LO<10> and LO<14>, two switching units may output signals simultaneously during a pulse of the control signals. For example, the switching unit 4101 and the switching unit 4202 may output signals simultaneously during a pulse of the control signal LO<6>. Therefore, although the weighting coefficients corresponding to the output signals of these switching units are all equal to 20, their output nodes can't be coupled together. In this case, two weighting units 4301 and 4302 with the same weighting factor are used to weight the output signals of the switching units separately.

The mixer 400 may also include a load module 440. The load module 440 has a set of transistor pairs. Each of the transistor pair is coupled to the differential output nodes of a weighting unit. The output nodes of the load module 440 are coupled in series with a resonance circuit such as an LC resonance circuit, which converts a current signal outputted by the transistor pair into a voltage signal, so that the output signal generated by the mixer 400 is a voltage signal. In addition, the resonance frequency of the LC resonance circuit 450 may be configured close to the expected frequency to maximize the gain of the output signal at the expected frequency.

Figure 8:
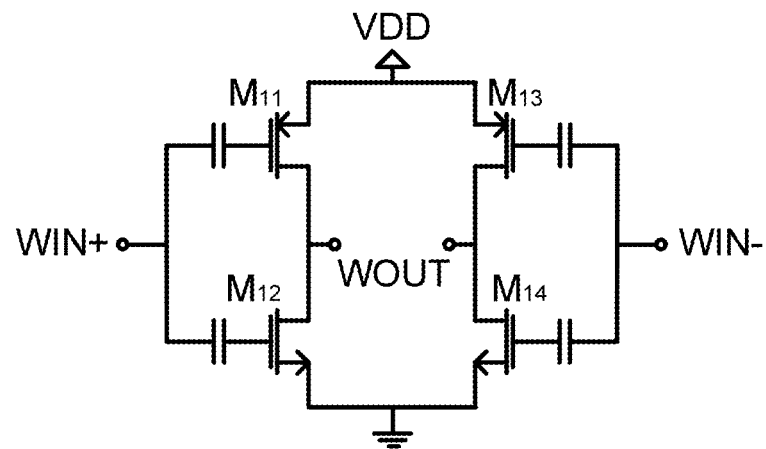
FIG. 8 shows a circuit implementation of the weighting unit of the mixer 200 and the mixer 400, as shown in FIG. 2 and FIG. 7 respectively.

FIG. 8 shows a circuit implementation of the weighting units of the mixer 200 shown in FIG. 2 or the mixer 400 shown in FIG. 7.

As shown in FIG. 8, the weighting unit has two pairs of MOS transistors $M_{11}$ and $M_{12}$, $M_{13}$ and $M_{14}$, with differential input nodes WIN+ and WIN− and differential output nodes WOUT+ and WOUT−. The transistors $M_{11}$ and $M_{13}$ are PMOS transistors, and the transistors $M_{12}$ and $M_{14}$ are NMOS transistors. Gates of the transistors $M_{11}$ and $M_{12}$ are coupled together and serve as the positive input node WIN+. Gates of the transistors $M_{13}$ and $M_{14}$ are coupled together and serve as the negative input node WIN−. The positive input node WIN+ and the negative input node are used to receive input signals. Sources of the transistors $M_{11}$ and $M_{13}$ are coupled to a high voltage level. Sources of the transistors $M_{12}$ and $M_{14}$ are coupled to a low voltage level. Drains of the transistors $M_{11}$ and $M_{12}$ are coupled together and serve as the positive output node WOUT+ of the weighting unit. Drains of the transistors $M_{13}$ and $M_{14}$ are coupled together and serve as the negative output node WOUT− of the weighting unit. The positive output node WOUT+ and the negative output node WOUT− are used to output the weighted signal. Moreover, each transistor has an input capacitor coupled at its gate.

Figure 9:
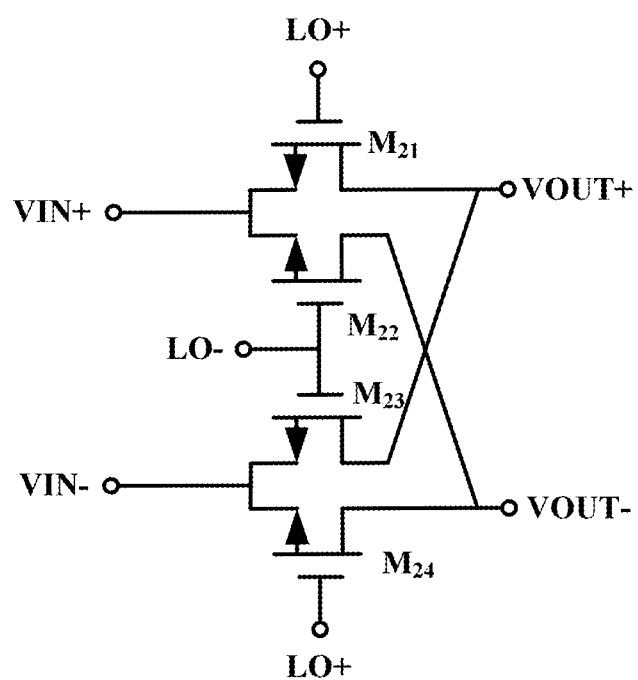
FIG. 9 shows a circuit implementation of the weighting unit of the mixer 200 and the mixer 400, as shown in FIG. 2 and FIG. 7 respectively.

FIG. 9 shows a circuit implementation of the switching units of the mixer 200 shown in FIG. 2 or the mixer 400 shown in FIG. 7.

As shown in FIG. 9, the switching units have a first differential transistor pair of MOS transistors $M_{21}$, $M_{22}$ and a second differential transistor pair of MOS transistors $M_{23}$, $M_{24}$. Each of the switching units has a pair of differential signal input nodes including a positive input node $V_{in}+$ and a negative input node $V_{in}-$, a pair of differential signal output nodes including a positive output terminal $V_{out}+$ and a negative output terminal $V_{out}-$, and a pair of control signal input nodes including a positive control signal input terminal LO+ and a negative control signal input node LO−. Sources of the transistors $M_{21}$ and $M_{22}$ are coupled with each other to the positive input node $V_{in}+$. Sources of the transistors $M_{23}$ and $M_{24}$ are coupled with each other to the negative input node $V_{in}-$. Drains of the transistors $M_{21}$ and $M_{23}$ are coupled with each other to the positive output terminal $V_{out}+$. Drains of the transistors $M_{22}$ and $M_{24}$ are coupled with each other to the negative output terminal $V_{out}-$. Gates of the transistors $M_{21}$ and $M_{24}$ are coupled with each other to the positive control signal input node LO+. Gates of the transistors $M_{22}$ and $M_{23}$ are coupled with each other to the negative control signal input node LO−. The pair of differential signal input nodes ($V_{in}+$, $V_{in}-$) of the double balanced mixer corresponds to the pair of differential signal input nodes of the switching module. The pair of control signal input node (LO+, LO−) corresponds to the pair of control signal input nodes of the switching module.

During the pulse of the control signal inputted at the positive control signal input nodes (LO+), the switching unit outputs the weighted signal received at its output nodes. During the pulse of the control signal inputted at the negative control signal input nodes (LO−), the switching unit outputs an inverting signal of the weighted signal received at its output nodes. During the non-pulse period of the control signals inputted at the positive control signal input nodes (LO+) and at the negative control signal input nodes (LO−), the output nodes of the switching unit are in high resistance state, i.e., do not output signals.

Figure 10:
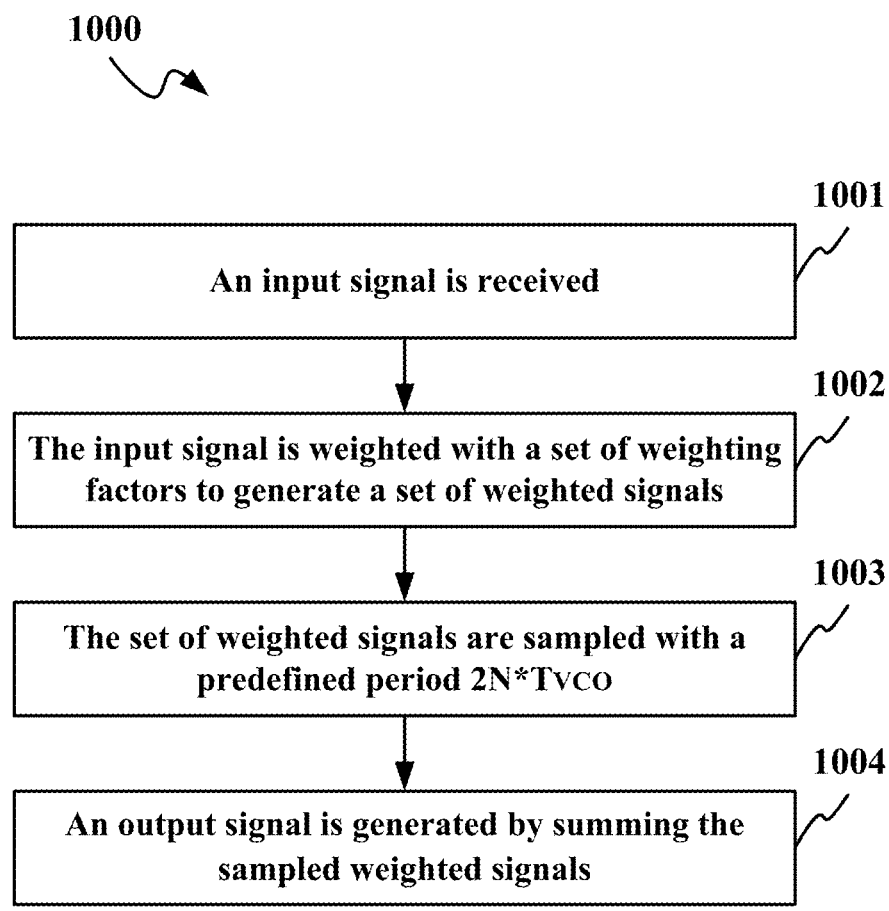
FIG. 10 shows a signal mixing method according to an embodiment of the application.

FIG. 10 shows a signal mixing method 1000 according to an embodiment of the application. In applications, the method 1000 may be implemented, for example, by the circuits shown in FIG. 1, FIG. 2 or FIG. 6.

As shown in FIG. 10, the method 1000 comprises steps as follows. In step 1001, an input signal is received. In step 1002, the input signal is weighted with a set of weighting factors to generate a set of weighted signals. In step 1003, the set of weighted signals with a predefined period of $2N*T_{VCO}$ is sampled, wherein each period contains at most 2N sampling pulses with a pulse width not greater than $T_{VCO}$, the at most 2N sampling pulses do not overlap with each other, and each sampling pulse is for sampling one of the set of weighted signals. In step 1004, the sampled weighted signals to summed to generate an output signal, wherein the output signal has a frequency shift of m/(2N*Tvco) as compared with the input signal, where m and N are integers, and 0<m<N.

In some embodiments, the set of weighting factors in step 1002 are selected from a weighting coefficient set or a subset thereof, wherein the weighting coefficient set is a set of coefficients generated by quantizing a function $$A\sin\left(2\pi m \cdot \frac{i}{2N} + \theta\right) + B$$

and/or function $$A\cos\left(2\pi m \cdot \frac{i}{2N} + \theta\right) + B,$$

where i=0, 1, 2, . . . , (2N−1), A, B and θ are all predefined real numbers. The relationship between the output signal $V_{out}$ and the input signal $V_{in}$ may be given by Equation (1).

Figure 11:
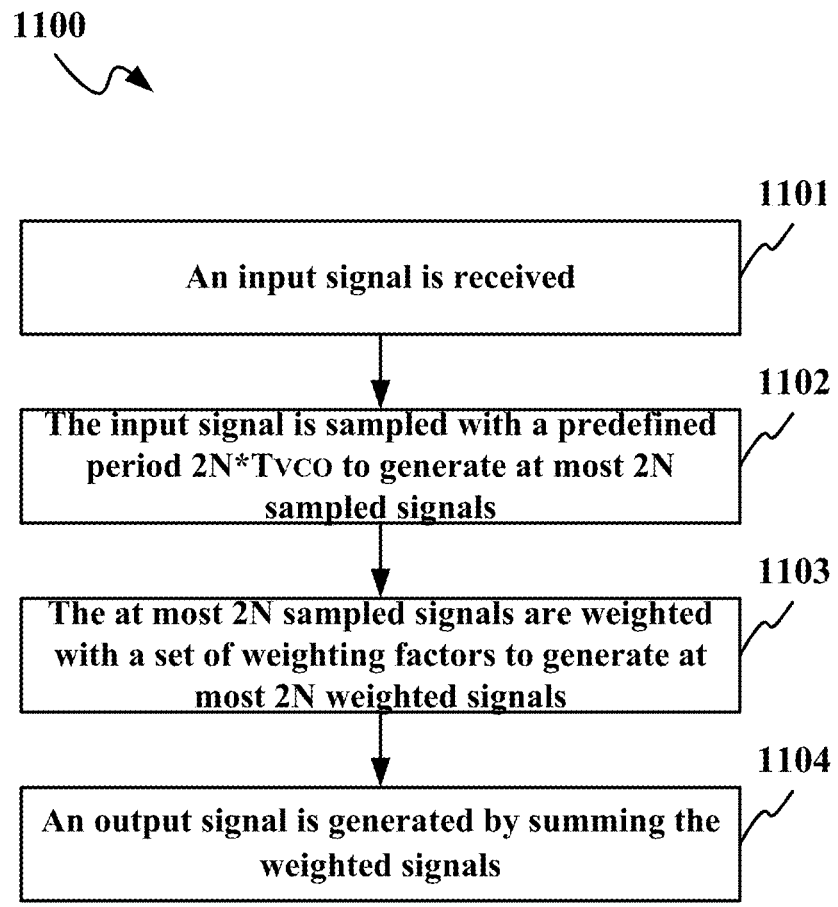
FIG. 11 shows a signal mixing method according to an embodiment of the application.

FIG. 11 shows a signal mixing method 1100 according to an embodiment of the present application. In applications, the method 1100 may be implemented by the circuit shown in FIG. 7.

As shown in FIG. 11, the method 1100 comprises steps as follows. In step 1101, an input signal is received. In step 1102, the input signal with a predefined period of $2N*T_{VCO}$ to generate at most 2N sampled signals is sampled, wherein each period contains at most 2N sampling pulses with a pulse width not greater than $T_{VCO}$, the at most 2N sampling pulses do not overlap with each other, and each sampling pulse is for sampling the input signal. In step 1103, the at most 2N sampled signals is weighted with a set of weighting factors to generate at most 2N weighted signals. In step 1104, the weighted signals are summed to generate an output signal, wherein the output signal has a frequency shift of m/(2N*Tvco) as compared with the input signal, where m and N are integers, and 0<m<N.

In some embodiments, the set of weighting factors in step 1103 are selected from a weighting coefficient set or a subset thereof, wherein the weighting coefficient set is a set of coefficients generated by quantizing a function $$A\sin\left(2\pi m \cdot \frac{i}{2N} + \theta\right) + B$$

or function $$A\cos\left(2\pi m \cdot \frac{i}{2N} + \theta\right) + B,$$

where i=0, 1, 2, . . . , (2N−1), A, B and θ are all predefined real numbers. The relationship between the output signal $V_{out}$ and the input signal $V_{in}$, may be given by Equation (1).

Those skilled in the art may understand and implement other variations to the disclosed embodiments from a study of the drawings, the disclosure, and the appended claims. In the claims, the word "comprising" does not exclude other elements or steps, and the indefinite article "a" or "an" does not exclude a plurality. In applications according to present application, one element may perform functions of several technical feature recited in claims. Any reference signs in the claims should not be construed as limiting the scope. The scope and spirit of the present application is defined by the appended claims.

What is claimed is:

1. A mixer, comprising:
   a weighting module configured to receive an input signal and weight the input signal with a set of weighting factors to generate a set of weighted signals; and
   a switching module configured to receive the set of weighted signals and at least a portion of 2N periodic control signals, each periodic control signal having a period of 2N*Tvco which contains a pulse with a pulse width not greater than Tvco; wherein Tvco denotes a period of a voltage control oscillating (VCO) signal, N is an integer, and the pulses of the 2N periodic control signals do not overlap with each other; and
   whereby the switching module cyclically outputs the set of weighted signals, under the control of the received periodic control signals, to generate an output signal having a frequency shift of m/(2N*Tvco) as compared with the input signal, where m is an integer and 0<m<N;
   wherein the set of weighting factors are selected from a weighting coefficient set or a subset thereof, and wherein the weighting coefficient set is a set of coefficients generated by quantizing a function $$A\cos\left(2\pi m \cdot \frac{i}{2N} + \theta\right) + B \text{ and/or } A\sin\left(2\pi m \cdot \frac{i}{2N} + \theta\right) + B,$$

where i=0, 1, 2, . . . (2N−1), and A, B and θ are all predefined real numbers.

2. The mixer of claim 1, wherein the mixer is of a differential structure, and the switching module comprises a set of switching units, each switching unit being configured to receive a pair of periodic control signals and one of the set of weighting signals, and to output the weighted signal in response to the pair of periodic control signals.

3. The mixer of claim 2, wherein the number of the set of switching units is not greater than N.

4. The mixer of claim 2, wherein each of the set of switching units has an output node for outputting the received weighted signal, and wherein the output nodes of the set of switching units are coupled together.

5. The mixer of claim 1, wherein the output signal is given by an equation below:

$$V_{OUT}(t) = V_{IN}(t) \cdot \sum_j \sum_{i=0}^{2N-1} k_i p(t - (i + 2Nj) \cdot T_{VC0})$$

where $V_{IN}(t)$ denotes the input signal, $V_{OUT}(t)$ denotes the output signal, $k_i$ denotes the weighting coefficients given by $$k_i = A\cos\left(2\pi m \cdot \frac{i}{2N} + \theta\right) + B \text{ or } k_i = A\sin\left(2\pi m \cdot \frac{i}{2N} + \theta\right) + B,$$

and p(t) denotes a pulse function, where i=0, 1, 2, . . . ,(2N−1).

6. The mixer of claim 1, wherein the 2N periodic control signals are generated by a local oscillating signal with a period equal to Tvco.

7. The mixer of claim 1, wherein the weighting module comprises a set of weighting units, each weighting unit being configured to weight the input signal using with a weighting factor of the set of weighting factors.

8. A mixer, comprising:
a switching module configured to receive an input signal and at least a portion of 2N periodic control signals, each periodic control signal having a period of 2N*Tvco which contains a pulse with a width not greater than Tvco; wherein Tvco denotes a period of a VCO signal, N is an integer and the pulses of the 2N periodic control signals do not overlap with each other; and whereby the switching module cyclically outputs the set of weighted signals, under the control of the received periodic control signals; and
a weighting module configured to receive the set of weighted signals and weight the set of weighted signals with a set of weighting factor respectively, to generate an output signal having a frequency shift of m/(2N*Tvco) as compared with the input signal, where m is an integer and 0<m<N;
wherein the set of weighting factors are selected from a weighting coefficient set or a subset thereof, and wherein the weighting coefficient set is a set of coefficients generated by quantizing a function $$A\cos\left(2\pi m \cdot \frac{i}{2N} + \theta\right) + B$$

and/or function $$A\sin\left(2\pi m \cdot \frac{i}{2N} + \theta\right) + B,$$

where i=0, 1, 2, . . . (2N−1), A, B and θ are all predefined real numbers.

9. The mixer of claim 8, wherein the mixer is of a differential structure, and the switching module comprises a set of switching units, each switching unit being configured to receive a pair of periodic control signals, and to output the input signal in response to the pair of periodic control signals.

10. The mixer of claim 9, wherein the number of the set of switching units is not greater than N.

11. The mixer of claim 8, wherein the weighting module comprises a set of weighting units, and wherein each weighting unit has an output node, and is configured to weight the input signal with one of the set of weighting factors to generate a weighted signal at its output node.

12. The mixer of claim 11, wherein the output nodes of the set of weighting units are coupled together.

13. The mixer of claim 12, further comprising a load module having a set of transistor pairs, wherein sources of transistors of each transistor pair are coupled to the output nodes of one of the set of switching units, and drains of the set of transistor pairs are coupled together.

14. The mixer of claim 13, further comprising a resonance circuit coupled to the drains of the set of transistor pairs.

15. The mixer of claim 8, wherein the output signal is given by an equation below:

$$V_{OUT}(t) = V_{IN}(t) \cdot \sum_j \sum_{i=0}^{2N-1} k_i p(t - (i + 2Nj) \cdot T_{VCO}),$$

where $V_{IN}(t)$ denotes the input signal, $V_{OUT}(t)$ denotes the output signal, $k_i$ denotes the weighting coefficients given by $$k_i = A\cos\left(2\pi m \cdot \frac{i}{2N} + \theta\right) + B \text{ or } k_i = A\sin\left(2\pi m \cdot \frac{i}{2N} + \theta\right) + B,$$

and p(t) denotes a pulse function, where i=0, 1, 2, . . . ,(2N−1).

16. The mixer of claim 8, wherein the 2N periodic control signals are generated by a local oscillating signal with a period equal to Tvco.

17. A signal mixing method, comprising:
receiving an input signal;
weighting the input signal with a set of weighting factors to generate a set of weighted signals;
sampling the set of weighted signals with a predefined period 2N*$T_{vco}$, wherein each period contains at most 2N sampling pulses each having a pulse width not greater than $T_{vco}$, Tvco denotes a period of a VCO signal, N is an integer, the at most 2N sampling pulses do not overlap with each other, and each sampling pulse is for sampling one of the set of weighted signals; and
summing the sampled weighted signals to generate an output signal, wherein the output signal has a frequency shift of m/(2N*Tvco) as compared with the input signal, where m is an integer and 0<m<N;
wherein the set of weighting factors are selected from a weighting coefficient set or a subset thereof, and wherein the weighting coefficient set is a set of coefficients generated by quantizing a function $$A\sin\left(2\pi m \cdot \frac{i}{2N} + \theta\right) + B \text{ and/or } A\cos\left(2\pi m \cdot \frac{i}{2N} + \theta\right) + B,$$

where i=0, 1, 2, . . . ,(2N−1), A, B and θ are all predefined real numbers.

18. The method of claim 17, wherein the output signal is given by an equation below:

$$V_{OUT}(t) = V_{IN}(t) \cdot \sum_{j} \sum_{i=0}^{2N-1} k_i p(t - (i + 2Nj) \cdot T_{VCO}),$$

where $V_{IN}(t)$ denotes the input signal, $V_{OUT}(t)$ is the output signal, $k_i$, denotes the weighting coefficients given by $$k_i = A\cos\left(2\pi m \cdot \frac{i}{2N} + \theta\right) + B \text{ or } k_i = A\sin\left(2\pi m \cdot \frac{i}{2N} + \theta\right) + B,$$

and p(t) denotes a pulse function, where i=0, 1, 2, . . . ,(2N−1).

19. A signal mixing method, comprising:
receiving an input signal;
sampling the input signal with a predefined period of $2N*T_{vco}$ to generate at most 2N sampled signals, wherein each period contains at most 2N sampling pulses each having a pulse width not greater than $T_{vco}$, Tvco denotes a period of a VCO signal, N is an integer, the at most 2N sampling pulses do not overlap with each other, and each sampling pulse is for sampling the input signal;
weighting the at most 2N sampled signals with a set of weighting factors to generate at most 2N weighted signals; and
summing the weighted signals to generate an output signal, wherein the output signal has a frequency shift of m/(2N*Tvco) as compared with the input signal, where m is an integer and 0<m<N;
wherein the set of weighting factors are selected from a weighting coefficient set or a subset thereof, and wherein the weighting coefficient set is a set of coefficients generated by quantizing a function $$A\sin\left(2\pi m \cdot \frac{i}{2N} + \theta\right) + B$$

and/or function $$A\cos\left(2\pi m \cdot \frac{i}{2N} + \theta\right) + B,$$

where i=0, 1, 2, . . . ,(2N−1), A, B and θ are all predefined real numbers.

20. The method of claim 19, wherein the output signal is given by an equation below:

$$V_{OUT}(t) = V_{IN}(t) \cdot \sum_{j} \sum_{i=0}^{2N-1} k_i p(t - (i + 2Nj) \cdot T_{VCO}),$$

where $V_{IN}(t)$ denotes the input signal, $V_{OUT}(t)$ is the output signal, $k_i$ denotes the weighting coefficients given by $$k_i = A\cos\left(2\pi m \cdot \frac{i}{2N} + \theta\right) + B \text{ or } k_i = A\sin\left(2\pi m \cdot \frac{i}{2N} + \theta\right) + B,$$

and p(t) denotes a pulse function, where i=0, 1, 2, . . . ,(2N−1).

* * * * *